United States Patent [19]

Voss

[11] 4,086,612
[45] Apr. 25, 1978

[54] THYRISTOR

[75] Inventor: Peter Voss, Munich, Germany

[73] Assignee: Siemens Aktiengesellschaft, Munich, Germany

[21] Appl. No.: 665,654

[22] Filed: Mar. 10, 1976

Related U.S. Application Data

[63] Continuation of Ser. No. 478,809, Jun. 12, 1974, abandoned.

[30] Foreign Application Priority Data

Jun. 12, 1973 Germany ............................. 2329872

[51] Int. Cl.² ............................................ H01L 29/74
[52] U.S. Cl. ........................................ 357/38; 357/20; 357/51; 357/86
[58] Field of Search ...................... 357/20, 38, 39, 86, 357/51

[56] References Cited

U.S. PATENT DOCUMENTS

| | | |
|---|---|---|
| 3,586,927 | 6/1971 | Roach et al. ............................. 357/38 |
| 3,590,346 | 6/1971 | Bilo et al. ................................ 357/38 |
| 3,879,744 | 4/1975 | Dumas .................................... 357/39 |

Primary Examiner—Stanley D. Miller, Jr.
Assistant Examiner—Joseph E. Clawson, Jr.
Attorney, Agent, or Firm—C. L. Menzemer

[57] ABSTRACT

The present invention is directed to a thyristor comprising a body of semiconductor material with at least four zones of alternating conductivity type, of which the first zone represents an emitter zone and is provided with an emitter electrode, a second zone adjacent said first zone represents a base zone and is provided with an electrode, with at least one pn junction between the emitter zone and the base zone, and with at least one shunt bridging the pn junctions, this shunt being a current path located in the base zone or in the emitter zone, uninterrupted by any pn junction, located on the surface of the semiconductor body, and directly connecting the emitter electrode and the base electrode.

3 Claims, 7 Drawing Figures

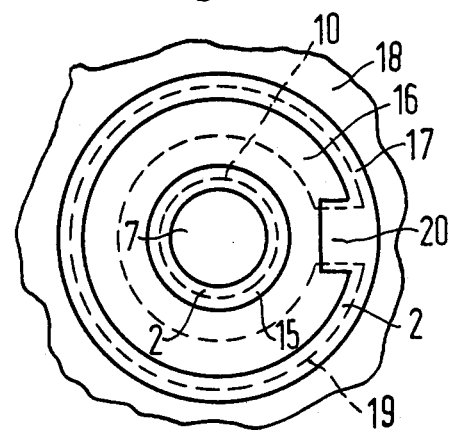
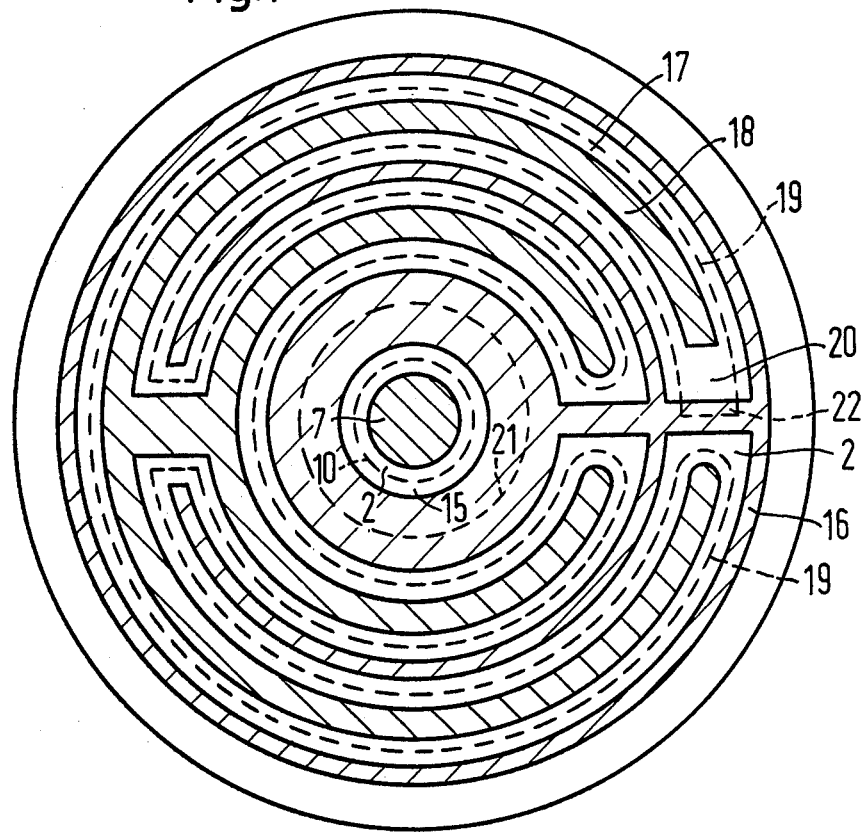

THYRISTOR

This is a continuation of application Ser. No. 478,809 filed June 12, 1974 now abandoned.

BACKGROUND OF THE INVENTION

1. Field of the Invention

This invention is in the field of semiconductor devices and is particularly directed to four or more region solid state switching devices.

2. Description of Prior Art

In prior art thyristor or four or more zone solid state switches one or two approaches have been taken to electrically shunt an emitter electrode zone to an adjacent base zone.

Such shunt between the emitter zone and the base zone prevents the unintentional firing of the thyristor without a control current especially at temperatures above the room temperature. In one of the known prior art approaches the shunt is formed so that the emitter electrode extends over the emitter zone and is thereby electrically connected with the adjacent base zone. This is sometimes called the circumferential shunt.

In the case of other thyristors there are provided, either in place of, or in addition to the shunt formed by extending the emitter electrode on to the base zone, several shunts in the form of apertures in the emitter zone through which the base zone extends and is thereby electrically connected with the emitter zone. This is sometimes called hole shunts.

The circumferential shunt is not as effective in case of large-surface thyristors as the hole shunt. The holes located in the emitter zone however hamper the spreading of the turn-on process. But unrestricted spreading of the turn-on process is important especially in case of fast acting thyristors.

SUMMARY OF THE INVENTION

In accordance with the teachings of this invention there is provided a semiconductor device comprising a body of semiconductor material, said body having at least four zones of alternating conductivity type, p-n junctions between each of the adjacent zones, a first electrode affixed to one of said zones, a second electrode affixed to said adjacent zone and at least one shunt between said electrodes that bridges said p-n junction between said one zone and said adjacent zone, said shunt being a conductive path at the surface of said body between said electrodes, said conductive path not being interrupted by said p-n junction.

The one emitter zone may be suitably provided with a projection, located on the surface of the zone, and reaching under the second electrode, or with a recess reaching under the first electrode. The second electrode may also have a recess into which extends the projection of the one zone and touches the second electrode. The second electrode may be the gating or control electrode of the thyristor or, in case of a thyristor with integral auxiliary thyristor with an auxiliary emitter electrode connected with the base zone, the auxiliary emitter electrode. An especially suitable further development of the latter design will be obtained when the main emitter electrode and the main emitter on one side, and the auxiliary emitter electrode on the other side consists of several parallel conductively connected strips in such a way that the strips of the main emitter and the main emitter electrode are interdigitated with the strips of the auxiliary emitter electrode, and at least one strip of the main emitter reaches with its free end under the auxiliary emitter electrode.

BRIEF DESCRIPTION OF THE DRAWINGS

In the accompanying drawings, the present preferred embodiment of the invention and present preferred methods of practicing the invention are illustrated in which:

FIGS. 2 to 7 are top view of thyristors illustrating modifications of the present invention;

DESCRIPTION OF PREFERRED EMBODIMENTS

Figure 1:
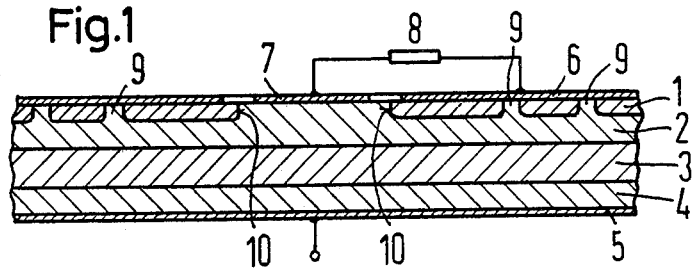
FIG. 1 is a side view, in cross-section, of a body of semiconductor with a thyristor, incorporating the teachings of this invention formed therein.

With reference to FIG. 1, there is shown a body of semiconductor material comprised of an emitter zone 1 and a base zone 2 as well as two additional zones 3 and 4. The zone 4 is provided with an electrode 5. The emitter zone 1 is provided with the emitter electrode 6. Another electrode 7 is the gate electrode and it is connected to the base zone 2.

The emitter zone 1 has apertures 9 through which the base zone 2 is connected to the emitter electrode 6. The apertures 9 serve in the known manner for increasing the dv/dt value of the thyristor. Between the emitter zone 1 and the base zone 2 is located a p-n junction indicated by the numeral 10.

For explanation of the mode of operation of the invention it is assumed that the emitter electrode 6 and the additional electrode 7 are connected through a resistance 8. This resistance represents a connection between the emitter zone electrode 6 and the base zone electrode 7, i.e., it has the same effect in regard to the dv/dt value behavior as the apertures 9 provided in the emitter zone 1. By means of this measure, the number of the apertures 9 can be reduced.

Figure 2:
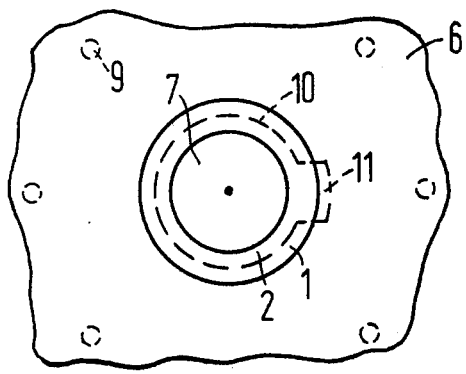

With reference to FIG. 2 the effect of the resistor 8 can be obtained by a recess 11 in the emitter zone 1 touching under the emitter electrode 6. In this way there is provided a direct current path from the emitter electrode 6 to the additional base electrode 7, the gate electrode, bridging at one point over the p-n junction 10. In this way, a part of the charge carriers coming from the inside of the semiconductor element flows through the base zone, the base electrode 7, the recess 11, and the emitter electrode 6, without causing injection of charge carriers from the emitter zone 1 into the base zone 2. In this way, the firing of the thyristor is prevented up to a certain value of dv/dt.

Figure 3:
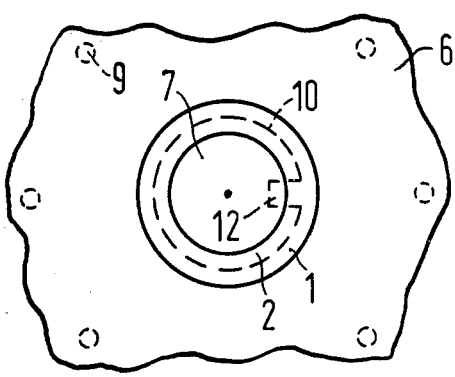

With reference to FIG. 3 the current path between the emitter electrode 6 and the base electrode 7 is obtained through a projection 12 of the emitter zone 1 reaching under the base electrode 7. Under the assumption that the emitter zone 1 is doped considerably more than the base zone 2, which is always the case in thyristors, the projection 12 may be made considerably smaller than the recess 11. The turn-on process spreads in a less restricted manner than in the previous embodiment of FIG. 2, since the interstice in the p-n junction is relatively small and it is not short-circuited.

The resistance of the current path is determined by the length and the width of the projection of the recess and by the doping level of each respective zone which reaches under one of the two electrodes. Since the doping of a thyristor is essentially fixed, the resistance will be adjusted only by the length and the width or, when etching is used, also by the thickness of the current path. Should a higher resistance be needed it would be sufficient to make the recess or projection small. But in this way under some circumstances the current path may become overloaded in case of currents flowing for longer periods of time. It is also possible to make the current path longer and wider but this again requires enlargement of the distance between the emitter electrode and the gate electrode.

Figure 4:
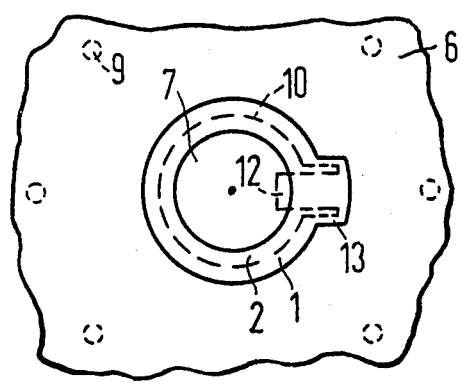
Figure 5:
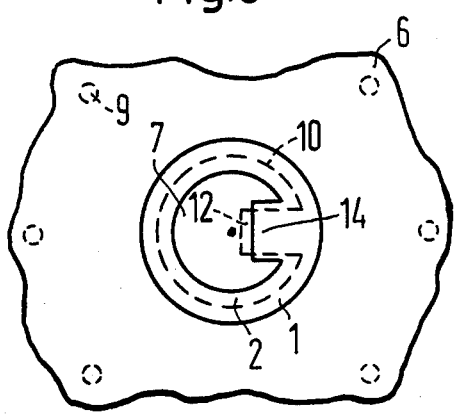

FIGS. 4 and 5 show two examples of embodiments which have a relatively long and large area current path with a small distance between the emitter electrode 6 and base electrode 7 at the same time. In FIG. 4, the emitter electrode is provided with a recess 13 into which the emitter zone 1 reaches. The latter is partially located in the recess 13, however on the other hand it has a projection 12 which is located under the base electrode 7. In the example of FIG. 5, the emitter zone 1 as well as the additional base electrode 7 have a recess 14.

The embodiment shown in FIG. 6 is provided with the so called internal gate current amplification structure. This consists of an auxiliary emitter zone 15 which is provided with an auxiliary emitter electrode 16. This auxiliary emitter electrode 16 extends over the edge of the auxiliary emitter zone 15 and it is there at the edge electrically connected with the base zone 2. Furthermore, the semiconductor element has a main emitter zone 17 on which is arranged the main emitter electrode 18. The principal mode of operation of the structure with internal gate current amplification is that the main thyristor belonging to the main emitter zone is fired by the load current of the auxiliary thyristor belonging to the auxiliary emitter zone. The p-n junction between the base 2 and the main emitter 17 is indicated by the numeral 19.

A connection between the emitter zone and the base zone in the way described before in order to improve the electrical characteristics can similarly be used between the main emitter zone 17 and the base zone 2. Here the current path is located between the main emitter electrode 18 and the auxiliary emitter electrode 16, since the outside edge of the latter path is electrically connected with the base zone 2. The current path is formed through the recess 20 connecting the main emitter zone 17 and the auxiliary emitter zone 15. The recess 20 extends under the auxiliary emitter electrode 16. In this way there is obtained a conducting connection between the main emitter electrode 18 and the base zone 2.

With reference to FIG. 7 there is also shown a semiconductor element for a thyristor with integral gate current amplification structure. The parts corresponding in their function to those of the structure of FIG. 6 are here indicated by the same reference numerals. For better clearness the electrodes are cross-hatched. The essential difference in construction is that here the main emitter zone 17, and the main emitter electrode 18, are formed from strips. The auxiliary emitter electrode 16 has also striplike portions and a portion located concentrically with respect to the additional electrode 7. The strip-like portions of the auxiliary emitter electrode 16, main emitter zone 17, and of the main emitter electrode 18 are interdigitated. The two emitter zones 15 and 17 in this case, contrary to the case in the FIG. 6, are not connected with each other.

The electrical connection between the main emitter zone 17 and the base zone 2 takes place through the auxiliary emitter electrode 16. An end 20 of a strip of the main emitter zone 17 thereby engages under the auxiliary emitter electrode 16. In this way there is provided an electrically conducting bridge 22 between the base zone 2 and the main emitter zone 17. In case of such arrangement with strip-like zones and electrodes it is possible under circumstances to eliminate completely the short-circuiting holes. In all examples of realization it is also possible to provide several bridges. This is recommended for example when the zone 20 cannot be made in a selected width.

I claim as my invention:
1. A thyristor comprising:
   A. a semiconductor body having opposed first and second surfaces and first, second, third and fourth zones of alternating conductivity type extending through the body from the first surface to the second surface with PN junctions formed between adjacent zones, said first and second zones being emitter and base zones, respectively, and having said PN junction therebetween adjoining said first surface;
   B. a first emitter electrode affixed to said first surface at said emitter zone;
   C. a second electrode affixed to said first surface at said base zone; and
   D. at least one shunt extending between said emitter and second electrodes through said semiconductor body at said first surface, each of said at least one shunt consisting of a projection in said base zone extending to adjoining said emitter electrode, and providing an electrically conductive path of a given resistance between said electrodes at said first surface uninterrupted by said PN junction between said emitter and base zones.

2. A. a semiconductor body having opposed first and second surfaces and first, second, thrid and fourth zones of alternating conductivity type extending through the body from the first surface to the second surface with PN junctions formed between adjacent zones, said first and second zones being emitter and base zones, respectively, and having said PN junction therebetween adjoining said first surface;
   B. a first emitter electrode affixed to said first surface at said emitter zone;
   C. a second electrode affixed to said first surface at said base zone, said second electrode being a gate electrode; and
   D. at least one shunt extending between said emitter and second electrodes through said semiconductor body at said first surface, each of said at least one shunt consisting of a projection in said base region extending to adjoin said emitter electrode, and providing an electrically conductive path of a given resistance between said electrodes at said first surface uninterrupted by said PN junction between said emitter and base zones.

3. A. a semiconductor body having opposed first and second surfaces and first, second, third and fourth zones of alternating conductivity type extending through the body from the first surface to the second surface with PN junctions formed between adjacent zones, said first and second zones being emitter and base zones, respectively, and having said PN junction therebetween adjoining said first surface;
   B. a first emitter electrode affixed to said first surface at said emitter zone;

C. a second electrode affixed to said first surface at said base zone; and
D. at least one shunt extending between said emitter and second electrodes through said semiconductor body at said first surface, each of said at least one shunts consisting of a projection in said base zone extending to adjoin said emitter electrode, and providing an electrically conductive path of a given resistance between said electrodes at said first surface uninterrupted by said PN junction between said emitter and base zones;
E. an auxiliary emitter zone disposed in said semiconductor body spaced adjacent the main emitter zone at said first surface to form with said second, third and fourth zones an auxiliary thyristor;
F. said second electrode affixed to the auxiliary emitter zone and base zone between said main and auxiliary emitter zones to form an emitter electrode for said auxiliary thyristor; and
G. a separate gate electrode affixed to the base zone spaced adjacent at least a portion of the auxiliary emitter zone with the auxiliary emitter electrode spaced between said gate electrode and the emitter electrode.

* * * * *